United States Patent
Takaya et al.

(10) Patent No.: US 8,597,769 B2
(45) Date of Patent: Dec. 3, 2013

(54) ETCHING MASK, BASE MATERIAL HAVING ETCHING MASK, FINELY PROCESSED ARTICLE, AND METHOD FOR PRODUCTION OF FINELY PROCESSED ARTICLE

(75) Inventors: Yoshiaki Takaya, Chiba (JP); Takuro Satsuka, Chiba (JP); Yoshihisa Hayashida, Chiba (JP); Takahisa Kusuura, Kanagawa (JP); Anupam Mitra, Tokyo (JP)

(73) Assignee: Maruzen Petrochemical Co. Ltd. (JP)

( * ) Notice: Subject to any disclaimer, the term of this patent is extended or adjusted under 35 U.S.C. 154(b) by 138 days.

(21) Appl. No.: 12/742,381

(22) PCT Filed: Nov. 13, 2008

(86) PCT No.: PCT/JP2008/003309
§ 371 (c)(1),
(2), (4) Date: Aug. 24, 2010

(87) PCT Pub. No.: WO2009/063639
PCT Pub. Date: May 22, 2009

(65) Prior Publication Data
US 2010/0310830 A1 Dec. 9, 2010

(30) Foreign Application Priority Data
Nov. 14, 2007 (JP) .................................. 2007-295452

(51) Int. Cl.
| | |
|---|---|
| C23F 1/02 | (2006.01) |
| C23F 1/08 | (2006.01) |
| C08F 132/08 | (2006.01) |
| B32B 3/10 | (2006.01) |

(52) U.S. Cl.
USPC ........... 428/172; 428/336; 428/339; 526/281; 216/41; 216/44; 216/49

(58) Field of Classification Search
USPC ......... 526/281; 216/41, 44, 49; 428/172, 336, 428/339
See application file for complete search history.

(56) References Cited

U.S. PATENT DOCUMENTS

| | | | | |
|---|---|---|---|---|
| 5,772,905 A | * | 6/1998 | Chou | 216/44 |
| 2010/0013122 A1 | * | 1/2010 | Toshifumi et al. | 264/293 |
| 2010/0019410 A1 | * | 1/2010 | Toshifumi et al. | 264/293 |

OTHER PUBLICATIONS

Monkkonen et al. J. Mater. Chem., 2000, 10, 2634-2636.*

(Continued)

*Primary Examiner* — Vu A Nguyen
(74) *Attorney, Agent, or Firm* — Factor Intellectual Property Law Group, Ltd.

(57) ABSTRACT

There are provided an etching mask which has a superior thermal imprinting characteristic and also a good anti-etching characteristic, a base material with the etching mask, a microfabricated product to which those etching mask and base material are applied, and a production method of the microfabricated product. The etching mask formed of a thermoplastic resin containing at least one kind of skeleton expressed by a chemical formula (1) or a chemical formula (2) in a main chain wherein $R^1$, $R^2$, $R^3$, $R^4$, $R^5$, $R^6$, $R^7$, $R^8$ in the formulae (1), (2) can be different or same one another, each of which is a hydrogen atom, a deuterium atom, a hydrocarbon group having a carbon number of 1 to 15, a halogen atom, or a substituent group containing a hetero atom like oxygen or sulfur, and may form a ring structure one another and wherein m and n are integers equal to or greater than 0.

18 Claims, 2 Drawing Sheets

(56) References Cited

OTHER PUBLICATIONS

TOPAS Cyclic Olefin Copolymer (COC), Mar. 2006.*
"Nanoimprint lithography in the cyclic olefin copolymer Topas(r), a highly ultraviolet-transparent and chemically resistant thermoplast" T Nielsen, et al., J. Vac. Sci. Technol. B 22(4), Jul./Aug. 2004 pp. 1770-1775.

EP Office Action dated Jul. 4, 2012 for Application No. 08 848 634.5-1226 (a related application).
Nielsen, T., et al. Nanoimprint Lithography in the Cyclic Olefin Copolymer, Topas (R), a Highly Ultraviolet-Transparent and Chemcially Resistant Thermoplast, J. Vac. Sci. Technology, Jul. 14, 2004, 1770-1775, Jul./Aug. 2004.

* cited by examiner

ETCHING MASK, BASE MATERIAL HAVING ETCHING MASK, FINELY PROCESSED ARTICLE, AND METHOD FOR PRODUCTION OF FINELY PROCESSED ARTICLE

RELATED APPLICATIONS

This application claims the filing benefit of International Patent Application No. PCT/JP2008/003309, filed Nov. 13, 2008, which claims the filing benefit of Japanese Patent Application No. 2007-295452 filed Nov. 14, 2007, the contents of which both are incorporated herein by reference.

TECHNICAL FIELD

The present invention relates to an etching mask with a superior imprinting characteristic, a base material with the etching mask, a microfabricated product and a production method of a microfabricated product.

BACKGROUND ART

An example of a technique of forming a fine pattern on a semiconductor substrate or a metal substrate is a photolithography technique of applying a photosensitive resin on a substrate, of forming a pattern through exposure, and of performing etching with the photosensitive resin being as a mask.

However, the photolithography technique includes complicates steps, and exposure devices are very expensive, so that substantial cost is requisite.

Accordingly, a thermal imprinting technique is proposed as one of the techniques of forming a fine pattern at a low cost (see, for example, patent literature 1). That is, this technique presses a mold having a fine pattern heated at a temperature equal to or higher than a glass transition temperature of a resin against a resin surface, and transfers the fine pattern of the mold on the melted resin surface.

[Patent Literature 1] U.S. Pat. No. 5,772,905 Publication

DISCLOSURE OF INVENTION

Problem to be Solved by the Invention

However, because the thermal imprinting technique is new, an etching mask which is proper not only for thermal imprinting but also for etching is still under development.

It is an object of the present invention to provide an etching mask which has a superior thermal imprinting characteristic and also a good anti-etching characteristic, a base material with the etching mask, a microfabricated product to which those etching mask and base material are applied, and a production method of the microfabricated product, in view of the foregoing problem.

Means for Solving the Problem

The etching mask of the present invention is formed of a thermoplastic resin containing at least one kind of skeleton expressed by a chemical formula (1) or a chemical formula (2) in a main chain.

[Chemical Formula 1]

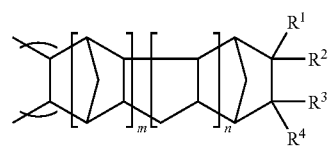

(1)

[Chemical Formula 2]

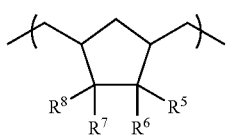

(2)

Wherein $R^1$, $R^2$, $R^3$, $R^4$, $R^5$, $R^6$, $R^7$, $R^8$ in the formulae (1), (2) can be different or the same as one another, each of which is selected from the group consisting of: a hydrogen atom; a deuterium atom; a hydrocarbon group having a carbon number of 1 to 15; a halogen atom; a substituent group containing a hetero atom like oxygen or sulfur; and a ring structure formed with one another. M and n are integers equal to or greater than 0.

In this case, the thermoplastic resin may be a copolymer of a cyclic olefin expressed by a chemical formula (3) and an α-olefin, or a polymer produced by hydrogenation after ring-opening polymerization of the cyclic olefin.

[Chemical Formula 3]

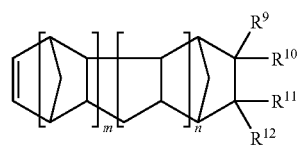

(3)

Wherein $R^9$, $R^{10}$, $R^{11}$, and $R^{12}$ in the formula (3) may be different or the same as one another, each of which is selected from the group consisting of: a hydrogen atom; a deuterium atom; a hydrocarbon group having a carbon number of 1 to 15; a halogen atom; a substituent group containing a hetero atom like oxygen or sulfur; and a ring structure formed with one another. M and n are integers equal to or greater than 0.

It is preferable that the etching mask of the present invention should be formed from an imprinting resin solution which contains the thermoplastic resin containing at least one kind of skeleton expressed by the chemical formula (1) or the chemical formula (2), and at least one kind of solvent that dissolves the resin, and which has a containing amount of foreign materials less than 3000 materials/cm³, each foreign material having a grain diameter of equal to or greater than 0.2 µm.

It is preferable that a remaining volatile constituent should be equal to or less than 0.25%. Moreover, it is preferable that a film thickness should be 10 nm to 40 µm. Furthermore, the etching mask of the present invention may have a predetermined pattern, and the pattern is appropriately formed through a thermal imprinting process.

A base material with an etching mask of the present invention comprises a base material main body and the foregoing etching mask formed on the base material main body.

In this case, the base material main body can be any one of followings: Si; $SiO_2$; and Mo.

A microfabricated product of the present invention comprises a base material formed of any one of Si, $SiO_2$, and Mo and the etching mask of the present invention formed on a base material main body, the etching-mask-formed base material having a predetermined pattern formed through a thermal imprinting process, wherein another predetermined pattern is formed on the base material main body by performing etching on the etching-mask-formed base material.

A method of producing a microfabricated product of the present invention comprises: forming the etching mask according to any one of claims 1 to 5 on a base material main body; forming a predetermined pattern in the etching mask through a thermal imprinting process; and performing etching on the base material with the etching mask with the pattern, thereby forming another predetermined pattern on the base material main body.

Effect of the Invention

The etching mask of the present invention has a superior thermal imprinting characteristic, and also a good anti-etching characteristic. Accordingly, using the etching mask, it is possible to form a fine pattern on a semiconductor substrate, a metal substrate or the like precisely at a low cost.

BEST MODE FOR CARRYING OUT THE INVENTION

Figure 1:
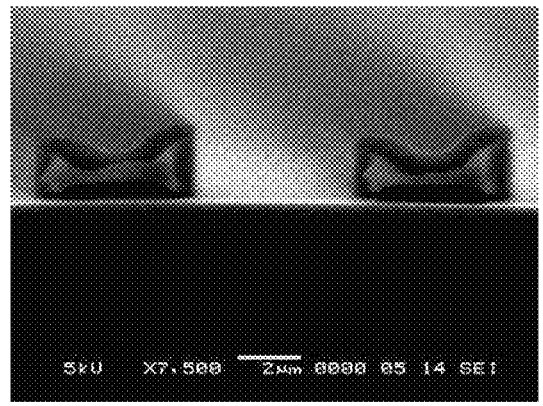
FIG. 1 is an SEM image showing a cross-sectional surface of an Si substrate and that of an etching mask prior to etching.

The present invention relates to an etching mask formed of a thermoplastic resin containing at least one kind of skeleton described in a chemical formula (1) or (2) in a main chain.

[Chemical Formula 4]

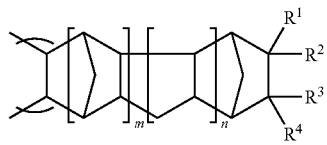

(1)

[Chemical Formula 5]

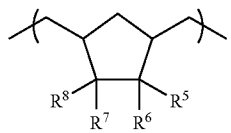

(2)

Note that $R^1, R^2, R^3, R^4, R^5, R^6, R^7, R^8$ in the formulae (1), (2) can be different or the same as one another, each of which is selected from the group consisting of: a hydrogen atom; a deuterium atom; a hydrocarbon group having a carbon number of 1 to 15; a halogen atom; a substituent group containing a hetero atom like oxygen or sulfur; and a ring structure formed with one another. M and n are integers equal to or greater than 0.

What is more preferable is a copolymer of a cyclic olefin with an α-olefin, i.e., a copolymer with an α-olefin containing a repeating unit originating from a cyclic olefin expressed by the formula (1), or a copolymer having undergone hydrogen addition after ring-opening polymerization of a cyclic olefin expressed by the formula (2).

A cyclic olefin monomer constituting the foregoing resin has a structure expressed by a chemical formula (3), and preferred examples of such monomer are bicyclo[2,2,1]hept-2-en (norbornene), 5-methylbicyclo[2,2,1]hept-2-en, 7-methylbicyclo[2,2,1]hept-2-en, 5-methylbicyclo[2,2,1]hept-2-en, 5-propylbicyclo[2,2,1]hept-2-en, 5-n-butylbicyclo[2,2,1]hept-2-en, 5-isobutylbicyclo[2,2,1]hept-2-en, 1,4-dimethylbicyclo[2,2,1]hept-2-en, 5-bromobicyclo[2,2,1]hept-2-en, 5-chlorobicyclo[2,2,1]hept-2-en, 5-fluorobicyclo[2,2,1]hept-2-en, 5,6-dimethylbicyclo[2,2,1]hept-2-en, dicyclopentadiene, tricyclopentadiene, tetracyclo[4,4,0,1$^{2.5}$,1$^{7.10}$]-3-dodecene, 5,10-dimethyltetracyclo[4,4,0,1$^{2.5}$,1$^{7.10}$]-3-dodecene, 2,10-dimethyltetracyclo[4,4,0,1$^{2.5}$,1$^{7.10}$]-3-dodecene, 11,12-dimethyltetracyclo[4,4,0,1$^{2.5}$,1$^{7.10}$]-3-dodecene, 2,7,9-trimethyltetracyclo[4,4,0,1$^{2.5}$,1$^{7.10}$]-3-dodecene, 9-ethyl-2,7-dimethyltetracyclo[4,4,0,1$^{2.5}$,1$^{7.10}$]-3-dodecene, 9-isobuthyl-2,7-dimethyltetracyclo[4,4,0,1$^{2.5}$,1$^{7.10}$]-3-dodecene, 9,11,12-trimethyltetracyclo[4,4,0,1$^{2.5}$,1$^{7.10}$]-3-dodecene, 9-ethyl-11,12-dimethyltetracyclo[4,4,0,1$^{2.5}$,1$^{7.10}$]-3-dodecene, 9-isobuthyl-11,12-dimethyltetracyclo[4,4,0,1$^{2.5}$,1$^{7.10}$]-3-dodecene, 5,8,9,10-tetramethyltetracyclo[4,4,0,1$^{2.5}$,1$^{7.10}$]-3-dodecene, 8-hexyltetracyclo[4,4,0,1$^{2.5}$,1$^{7.10}$]-3-dodecene, 8-stearyltetracyclo[4,4,0,1$^{2.5}$,1$^{7.10}$]-3-dodecene, 8-methyl-9-ethyltetracyclo[4,4,0,1$^{2.5}$,1$^{7.10}$]-3-dodecene, 8-cyclohexyltetracyclo[4,4,0,1$^{2.5}$,1$^{7.10}$]-3-dodecene, 8-ethylidenetetracyclo[4,4,0,1$^{2.5}$,1$^{7.10}$]-3-dodecene, 8-chlorotetracyclo[4,4,0,1$^{2.5}$,1$^{7.10}$]-3-dodecene, 8-bromotetracyclo[4,4,0,1$^{2.5}$,1$^{7.10}$]-3-dodecene, 8-fluorotetracyclo[4,4,0,1$^{2.5}$,1$^{7.10}$]-3-dodecene, 8,9-diclotetracyclo[4,4,0,1$^{2.5}$,1$^{7.10}$]-3-dodecene, hexacyclo[6,6,1,1$^{3.6}$,1$^{10.13}$,0$^{2.7}$,0$^{9.14}$]-4-heptadecene, 12-methylhexacyclo[6,6,1,1$^{3.6}$,1$^{10.13}$,0$^{2.7}$,0$^{9.14}$]-4-heptadecene, 12-ethylhexacyclo[6,6,1,1$^{3.6}$,1$^{10.13}$,0$^{2.7}$,0$^{9.14}$]-4-heptadecene, 12-isobutylhexacyclo[6,6,1,1$^{3.6}$,1$^{10.13}$,0$^{2.7}$,0$^{9.14}$]-4-heptadecene, 1,6,10-trimethyl-12-isobuthylhexacyclo[6,6,1,1$^{3.6}$,1$^{10.13}$,0$^{2.7}$,0$^{9.14}$]-4, 5-methyl-5-phenyl-bicyclo[2,2,1]hept-2-en, 5-ethyl-5-phenyl-bicyclo[2,2,1]hept-2-en, 5-n-propyl-5-phenyl-bicyclo[2,2,1]hept-2-en, 5-n-butyl-5-phenyl-bicyclo[2,2,1]hept-2-en, 5,6-dimethyl-5-phenyl-bicyclo[2,2,1]hept-2-en, 5-methyl-6-ethyl-5-phenylbicyclo[2,2,1]hept-2-en, 5,6,6'-trimethyl-5-phenyl-bicyclo[2,2,1]hept-2-en, 1,4,5-trimethylbicyclo[2,2,1]hept-2-en, 5,6-diethyl-5-phenylbicyclo[2,2,1]hept-2-en, 5-bromo-5-phenyl-bicyclo[2,2,1]hept-2-en, 5-chloro-5-phenyl-bicyclo[2,2,1]hept-2-en, 5-fluoro-5-phenyl-bicyclo[2,2,1]hept-2-en, 5-methyl-5-(tert-butylphenyl)-bicyclo[2,2,1]hept-2-en, 5-methyl-5-(bromophenyl)-bicyclo[2,2,1]hept-2-en, 5-methyl-5-(chlorophenyl)-bicyclo[2,2,1]hept-2-en, 5-methyl-5-(fluorophenyl)-bicyclo[2,2,1]hept-2-en, 5-methyl-5-(α-naphtyl)-bicyclo[2,2,1]hept-2-en, 5-methyl-5-anthracenyl-bicyclo[2,2,1]hept-2-en, 8-methyl-8-phenyl-tetracyclo[4,4,0,1$^{2.5}$,1$^{7.10}$]-3-dodecene, 8-ethyl-8-phenyl-tetracyclo[4,4,0,1$^{2.5}$,1$^{7.10}$]-3-dodecene, 8-n-propyl-8-phenyl-tetracyclo[4,4,0,1$^{2.5}$,1$^{7.10}$]-3-dodecene, 8-n-butyl-8-phenyl-tetracyclo[4,4,0,1$^{2.5}$,1$^{7.10}$]-3-dodecene, 8-chloro-8-phenyl-tetracyclo[4,4,0,1$^{2.5}$,1$^{7.10}$]-3-dodecene, 11-methyl-11-phenyl-hexacyclo[6,6,1,1$^{3.6}$,1$^{10.13}$,0$^{2.7}$,0$^{9.14}$]-4-heptadecene, and 1,4-methano-4-a,9,9'-trimethyl-1,4,9a-trihydrofluorene. Those kinds of monomer can be basically produced by thermal Diels-Alder reaction of a corresponding diene with an olefin, and execution of hydrogen addition as needed makes it possible to produce a desired monomer.

[Chemical Formula 6]

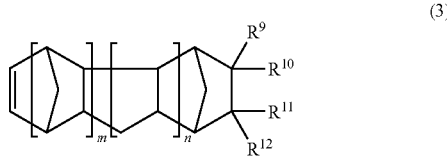

(3)

Wherein $R^9$, $R^{10}$, $R^{11}$, and $R^{12}$ in the formula (3) may be different or the same as one another, each of which is selected from the group consisting of: a hydrogen atom; a deuterium atom; a hydrocarbon group having a carbon number of 1 to 15; a halogen atom; a substituent group containing a hetero atom like oxygen or sulfur; and a ring structure formed with one another. M and n are integers equal to or greater than 0.

An example of the α-olefin appropriately used for the copolymer expressed by the formula (3) is an α-olefin having a carbon number of 2 to 20, preferably, a carbon number of 2 to 10, such as ethylene, propylene, 1-butene, 1-pentene, 3-methyl-1-butene, 3-methyl-1-pentene, 1-hexene, 1-octene, or 1-decene, and can be used singularly or combined together. Ethylene or propylene is preferable among those, and ethylene is especially preferable from the standpoint of a copolymerization characteristic, an economic efficiency, a practicality, and the like.

In the copolymer expressed by the formula (1), the molar ratio between the preferable α-olefin and the cyclic olefin is within a range from 10/90 to 90/10, and more preferably, is within a range from 30/70 to 70/30. The molar ratio in the copolymer is set through $^{13}$C-NMR (400 MHz, temperature: 120° C./solvent: 1,2,4-trichlorobenzene/1,1,2,2-deuterated tetrachloroethane mixing system). The weight-average molecular weight Mw of the cyclic-olefin-based thermoplastic resin expressed by the formula (1) or (2) is within a range from 1000 to 1000000, and preferably, from 5000 to 500000, and the resin has a preferable MFR actual measured value which is from 0.1 to 300, more preferably, from 0.5 to 250 at 260° C.

If there is a foreign material relatively larger than the film thickness present on the surface of an etching mask, such a part cannot be depressed well by a mold, resulting in a transfer failure in some cases. Accordingly, in order to suppress any production of a particle-like material originating from a foreign material on the surface of the etching mask, it is fine if a resin solution is filtrated through a conventionally-well-known technique. For example, when it is attempted to form an etching mask having a film thickness equal to or larger than 2 μm, as filtration is performed using a filter having apertures each being equal to or smaller than the half or the thickness of the thin film desirable to form, it becomes possible to appropriately eliminate foreign materials and insoluble matters in the resin solution which will cause a particle-like material to be produced. When it is desirable to suppress any particle-like material more precisely, or when an etching mask having a film thickness of smaller than 2 μm is to be formed, a process using a filter having apertures each being smaller than 0.8 μm enables a control. Note that the material of the filter can be changed appropriately depending on the kind of a solvent for the resin solution to be used. Moreover, a filter having no electrical-charge trapping function can be also used appropriately.

The glass transition temperature of the resin depends on the application of a product to which a fine pattern is transferred through thermal imprinting, and the resin expressed by the formula (1) or (2) can be prepared appropriately and used, but it is preferable that such a glass transition temperature should be 50° C. to 220° C. from the standpoint of a thermal imprint process.

A copolymerization technique of producing the resin is not limited to any particular one, and conventionally-well-known techniques, such as coordination polymerization using a Ziegler-Natta catalyst or a single-site catalyst, a technique of further performing hydrogen addition on a copolymer as needed, and a technique of performing hydrogen addition after ring-opening polymerization using a metathesis polymer catalyst. How to perform hydrogen addition can be also a conventionally-well-known technique, and can be carried out using a catalyst containing a metallic constituent like nickel, or palladium. Examples of the single-site catalyst used for producing the copolymer expressed by the formula (1) are various kinds of metallocene compound, and for example, methylene (cyclopentadienyl) (tetracyclopentadienyl) zirconium-dichloride or the like disclosed in JP2003-82017A can be used appropriately.

A promoter used for polymerization reaction is not limited to any particular one, but methylaluminoxanes which are conventionally well known can be used appropriately, and other organic aluminum compounds can be caused to coexist accordingly depending on a reaction to perform polymerization. The polymerization reaction can be carried out appropriately at a temperature within a range from a room temperature to 200° C., but it is desirable to carry out the polymerization reaction at a temperature within a range from 40 to 150° C. from the standpoint of the reactive character and the stability of a catalyst.

An organic solvent used for the polymerization reaction is not limited to any particular one, and for example, an aromatic solvent, such as benzene, toluene, xylene, or ethylbenzene, a saturated hydrocarbon solvent, such as hexane, cyclohexane, heptane, methylcyclohexane, or octane, or a mixed solvent thereof can be used appropriately. After the resin is produced, a hetero atom, such as an oxygen atom or a sulfur atom, can be appropriately introduced by a radical reaction. If various kinds of thermoplastic resins commercially available are prepared, such resins can be appropriately used to accomplish the object of the present invention.

It is possible to add and blend an antioxidant, a heat-resistant stabilizer, a weathering stabilizer, a light stabilizer, an antistatic agent, a slip agent, an anti-blocking agent, a leveling agent, an antifog additive, a lubricant, a colorant, a pigment, a natural oil, a synthetic oil, or a wax to the resin without deteriorating its function as an etching mask. The blending ratio thereof can be set accordingly. The antioxidant, the lubricant and the like to be added are not limited to any particular ones, and conventionally-well-known compounds can be use appropriately.

In order to form an etching mask which is uniform and has no unevenness from such a thermoplastic resin, it is preferable to use a thermoplastic resin solution prepared by dissolving the foregoing thermoplastic resin in a solvent.

Any solvent which can dissolve the resin can be used arbitrary. Examples of an aromatic solvent are benzene, toluene, xylene, mesitylene, p-menthane, ethyl-benzene, and diethyl-benzene, examples of a hydrocarbon solvent are cyclohexane, methylcyclohexane, and decahydronaphthalene, and examples of a halogen solvent are a dichloromethane, chloroform, chlorobenzene, dichlorobenzene, and trichlorobenzene, and those can be used appropriately. Those solvents can be used singularly, but equal to or greater than two kinds of those solvents can be mixed and used appropriately. It is fine if the solvent is heated in order to dissolve the resin therein. Moreover, in order to improve the solubility of additives, a tiny amount of alcohols or ketones can be added without deteriorating the solubility of the resin. The resin concentration can be adjusted arbitrary depending on the thickness of an etching mask to be produced, but it is desirable that such concentration should be set to 0.1% by weight to 30% by weight, more preferably, 0.1% by weight to 15% by weight in consideration of a throughput like a filtration speed.

A base material with an etching mask according to the present invention has the etching mask of the present invention formed on a base material main body formed of various materials.

The base material main body is formed of various materials, such as "Si (silicon)", "$SiO_2$ (silica dioxide)", "metal like aluminum, copper, or sapphire or a compound thereof", a "glass", or a "resin which is difficult to directly apply thermal imprinting". The shape of the base material main body is not limited to any particular shape if a thermal imprinting technique can be applied, and for example, can be a substrate-like shape, a film-like shape, and other three-dimensional shapes.

A conventionally-well-known technique, such as a spin coating technique, a solution casting technique, dipping, or spray coating can be adopted as the technique of forming the etching mask. One of factors of a resin thin film which can be subjected to thermal imprinting is remaining volatile constituents in the thin film. The thicker the film thickness is, the more the remaining volatile constituents are present after a drying process, and a foam formation phenomenon can be seen on the resin thin film at the time of thermal imprinting, resulting in deterioration of the pattern transfer precision. Accordingly, it is preferable that the remaining volatile constituents in the etching mask should be controlled to equal to or less than 0.25%, preferably, equal to or less than 0.15%. As a film thickness which enables reduction of the remaining volatile constituents in the etching mask appropriately, it is preferable that such a film thickness of the etching mask to be formed should be equal to or less than 40 µm.

In the drying process after film application, a normal thermal drying technique can be appropriately adopted. For example, vacuum drying, hot air circulating drying, hot plate drying can be appropriately adopted. It is possible to form a target etching mask if a thin film on the base material is subjected to pressure-reduction drying or drying by heating, but in order to suppress any foam formation originating from the solvent, it is preferable to perform pre-drying at a temperature lower than the boiling point of the solvent and then to increase the temperature to dry the thin film. In the drying process, in order to suppress any thermal deterioration of the resin, a condition under a nitrogen atmosphere or a pressure reduction condition is preferable, but a drying process under an atmosphere like a hot plate can be possible. Furthermore, in order to suppress any thermal deterioration at the time of drying as much as possible, an antioxidant or the like can be added to the resin solution without deteriorating the function as the etching mask.

Moreover, a normal molding room or laboratory can be used as a work environment at the time of etching mask formation, but more preferably, a clean booth or a clean room should be used in order to reduce any risk of foreign material contamination.

In order to form a predetermined pattern on the etching mask, a thermal imprinting technique can be applied. In this case, in order to quickly form a pattern on the base material by etching, it is preferable that a resin remaining film (the resin remaining at the bottom face of the concave portion of the pattern) on the pattern formed on the etching mask should be thin as far as possible.

As Devices for performing thermal imprinting, various products are available on the market, and the kind of such product can be selected accordingly. As a preferable size of a transfer pattern that is for satisfying a refinement requisition, it is desirable that such a pattern should have a size equal to or less than 10 µm, more preferably, equal to or less than 1 µm. Preferable in order to realize a process which has a superior pattern transfer precision and which improves the productivity are imprinting conditions, such that when the mold temperature is low, the cooling time can be shortened, and when the molding pressure is small and the retention time is short, the molding time can be shortened.

A microfabricated product of the present invention is one that a predetermined pattern is formed on the base material with the etching mask of the present invention by a thermal imprint process, and the base material with the etching mask is subjected to etching to form a predetermined pattern on the base material main body.

General kinds of etching, such as dry etching like physical etching or chemical etching, and wet etching can be applied. For example, reactive ion etching can be applied. Moreover, the remaining film which is the residue of the resin after etching can be eliminated by a solvent which can dissolve that resin or can be eliminated through a process like ashing.

Example applications of the imprint product are optical devices, such as a light waveguide, a light guiding plate, or a diffraction grating, a filed of bio-devices including a bio-chip, a fluidic device, such as a micro flow path, or a micro reactor, a medium for data saving, and a circuit substrate.

EXAMPLES

The present invention will now be explained with reference to examples below, but it should be understood that the present invention is not limited to the following examples.

Note that a weight-average molecular weight (Mw), a number average molecular weight (Mn), and a molecular weight distribution (Mw/Mn) of a resin used in the example were measured through a gel permeation chromatography (GPC) technique using a GPC device made by Waters corporation, and under conditions that a column: K-805L/K-806L made by Shodex, a column temperature: 40° C., a solvent: chloroform, and an amount of liquid caused to pass through: 0.8 mL/minute. Moreover, a glass transition temperature Tg (° C.) of a resin used in the example was acquired from an endothermic peak at the time of temperature rising using a differential scanning calorimetric analyzer (type: EXSTAR6000, DSC6200) made by SEIKO Instruments Inc. Furthermore, an actual measured value [M] of MFR at 260° C. was acquired at a load of 2.16 kgf using the MELT INDEXER (type: L248-2531) made by TECHNOL SEVEN Co., Ltd.

First, how a resin used for a thermal imprint evaluation was produced will be explained below.

Preparation of Resin Solution

Example Solution 1

4 pts. wt. of powders of resin 1 (ethylene/methylphenyl-norbornene copolymer, MFR @ 260° C.: 56.5, Mw: 136000, Tg: 135° C.) and 0.004 pts. wt. of an antioxidant (IRGA-NOX1010 made by Ciba Specialty Chemicals) were agitated and dissolved in 96 pts. wt. of decahydronaphthalene at a room temperature in a flask having undergone drying and nitrogen substitution, the solution was filtrated by a nylon-made filter with a pore diameter of 0.04 μm (PhotoShield N made by Cuno Corporation), and a resin solution for thermal imprinting was prepared.

The powders of resin 1 were produced through the following scheme. First, under ethylene atmosphere, toluene, methylphenylnorbornene, and methylaluminoxane/toluene solution were put in a 279-L reaction tank so that the concentration of 5-methyl-5-phenyl-bicyclo[2,2,1]hept-2-en (methylphenylnorbornene) became 0.80 mol/L, the concentration of methylaluminoxane (MAO20% toluene solution made by Nippon Aluminum Alkyls, Ltd.) became 25.0 mmol/L with reference to Al and the total liquid amount became 95 L.

Methylene (cyclopentadienyl) (tetramethylcyclopentadienyl) zirconium-dichloride, methylaluminoxane/toluene solution were added and a catalyst solution was prepared so that the concentration of methylene (cyclopentadienyl) (tetramethylcyclopentadienyl) zirconium-dichloride became 444 μmol/L, the concentration of methylaluminoxane became 144 mmol/L with reference to Al, and the total amount became 5 L.

The catalyst solution was supplied to a polymerization tank small amount by small amount, ethylene was introduced while the pressure was maintained at 0.2 MPa, and a reaction was caused for 160 min at 80° C. During the reaction, a methylphenylnorbornene/toluene solution prepared for 80 wt % was supplied so that the concentration of methylphenylnorbornene in the tank did not decrease together with consumption of ethylene. When 2.0 L of the catalyst solution, 3.52 Nm3 of ethylene, and 25.6 L of methylphenylnorbornene/toluene solution had been supplied, the reaction was terminated.

After the reaction, ethylene was subjected to pressure release while being stood to cool, and the interior of the system was subjected to nitrogen substituent. Thereafter, 1567 g of silica (made by Fuji Silysia Chemical Ltd., grade: G-3, grain diameter: 7 μm) having an adsorbed moisture amount adjusted for 10 wt % was added and a reaction was caused for 1 hour. The reaction solution was put in a pressure filtration device (made by Advantec Toyo Kaisha, Ltd., type: KST-293-2o-JA) in which a filter paper (5C, 300 mm) and sellite (WAKO) were set, was subjected to pressure filtration with nitrogen, and a polymerization liquid was collected. The polymerization liquid was dropped in acetone in six times its volume of water small amount by small amount, and a generated polymer was deposited. The deposited polymer was dissolved in toluene again, and dropped in acetone in six times its volume of water again small amount by small amount, and a polymer was deposited again. The acquired polymer was dried at 120° C. under a vacuum condition, and it was confirmed through GC measurement that no unreacted monomer remained in the polymer.

The yield of the acquired resin 1 was 14.1 kg, Mw=136000, and Mw/Mn=1.86, and the polymerization activity in this reaction was 174 kg-polymer/g-Zr. The glass transition temperature of the polymer was 135° C.

Example Solution 2

A thermal imprinting resin solution was prepared using the same resin and through the same scheme except that the blend amount of the antioxidant (IRGANOX1010 made by Ciba Specialty Chemicals) of the example resin solution 1 was changed to 0 pts. wt.

Example Solution 3

4 pts. wt. of powders of resin 2 (ethylene/norbornene-based copolymer, MFR @ 260° C.: 12.9, Mw: 122500, and Tg: 135° C.) and 4 pts. wt. of antioxidant (IRGANOX1010 made by Ciba Specialty Chemicals) were agitated and dissolved in 96 pts. wt. of decahydronaphthalene at a room temperature in a flask having undergone drying and nitrogen substitution, the solution was filtrated by a nylon-made filter (PhotoShield N made by Cuno Corporation) with a pore diameter of 0.04 μm, and a thermal imprinting resin solution was prepared.

The powders of resin 2 were produced through the following scheme. First, under a mixed gas atmosphere with a hydrogen/ethylene ratio=0.002, toluene, norbornene, and methylaluminoxane/toluene solution were put in a 279-L reaction tank with a jacket so that the concentration of bicyclo[2,2,1]hept-2-en (norbornene) became 2.10 mol/L, the concentration of methylaluminoxane (MAO20% toluene solution made by Nippon Aluminum Alkyls, Ltd.) became 4.0 mmol/L with reference to Al and the total liquid amount became 130 L.

Toluene, methylene (cyclopentadienyl) (tetramethylcyclopentadienyl) zirconium-dichloride, methylaluminoxane/toluene solution were added and a catalyst solution was prepared so that the concentration of methylene (cyclopentadienyl) (tetramethylcyclopentadienyl) zirconium-dichloride became 111 μmol/L, the concentration of methylaluminoxane became 120 mmol/L with reference to Al, and the total amount became 5 L.

The catalyst solution was supplied to a polymerization tank small amount by small amount, hydrogen and ethylene were introduced so that the hydrogen/ethylene ratio in a vapor-phase room in the polymerization tank became 0.002, while at the same time, the pressure was maintained at 0.2 MPa, and a reaction was caused for 150 min at 70° C. During the reaction, a norbornene/toluene solution of 75.92 wt % was supplied so that the concentration of norbornene in the tank did not decrease together with consumption of ethylene. When 23.6 L of the catalyst solution, 4.22 Nm3 of ethylene, and 40.6 L of norbornene/toluene solution had been supplied, the reaction was terminated.

The following procedures were same except that the amount of acetone used at the time of polymer deposition was changed to three times its volume of water.

The yield of the acquired resin 2 was 21.7 kg, Mw=122500, and Mw/Mn=1.41, and the polymerization activity in this reaction was 603 kg-polymer/g-Zr. The glass transition temperature of the polymer was 135° C.

Example Solution 4

A thermal imprinting resin solution was prepared using the same resin and through the same scheme as the example solution 3 except that the solution was filtrated by a PTFE-made filter (made by ADVANTEC Toyo Kaisha, Ltd.) with a pore diameter of 0.50 μM instead of the nylon-made filter with a pore diameter of 0.04 μm.

Example Solution 5

A thermal imprinting resin solution was prepared using the same resin and through the same scheme except that the blend amount of the antioxidant (IRGANOX1010 made by Ciba Specialty Chemicals) of the example resin solution 3 was changed to 0 pts. wt.

Example Solution 6

A thermal imprinting resin solution was prepared using the same resin and through the same method except that the solvent of the example solution 3 was changed to diethylbenzene.

Example Solution 7

3 pts. wt. of pellets of commercially-available thermoplastic resin 3 (ethylene/norbornene-based copolymer [product name: TOPAS6013 made by Ticona corporation], MFR @ 260° C.: 13.0, and Tg: 138° C.) was agitated and dissolved in 97 pts. wt. of decahydronaphthalene at a room temperature in a flask having undergone drying and nitrogen substitution. The solution was filtrated by a nylon-made filter (PhotoShield N made by Cuno Corporation) with a pore diameter of 0.2 µm. The filtrated solution was further filtrated by a nylon-made filter (PhotoShield N made by Cuno Corporation) with a pore diameter of 0.04 µm, and a thermal imprinting resin solution was prepared.

Example Solution 8

4 pts. wt. of pellets of commercially-available thermoplastic resin 4 (ring-opening polymer/hydrogenerated material [product name: zeonor 1420R made by Zeon Corporation], MFR @ 260° C.: 7.3, and Tg: 136° C.) was agitated and dissolved in 96 pts. wt. of decahydronaphthalene at a room temperature in a flask having undergone drying and nitrogen substitution. The solution was filtrated by a nylon-made filter (PhotoShield N made by Cuno Corporation) with a pore diameter of 0.2 µm. The filtrated solution was further filtrated by a nylon-made filter (PhotoShield N made by Cuno Corporation) with a pore diameter of 0.04 µm, and a thermal imprinting resin solution was prepared.

Example Solution 9

A thermal imprinting resin solution was prepared through the same scheme except that the blend amount of the powders of resin 1 of the example solution 1 and that of the solvent were changed to 11 pts. wt. of resin 1 powders, and 89 pts. wt. of decahydronaphthalene, respectively.

Example Solution 10

A thermal imprinting resin solution was prepared through the same scheme except that the blend amount of the powders of resin 2 of the example solution 3 and that of the solvent were changed to 10 pts. wt. of resin 2 powders, and 90 pts. wt. of naphthalene, respectively.

Example Solution 11

A thermal imprinting resin solution was prepared through the same scheme except that the blend amount of the pellets of commercially-available resin 3 of the example solution 7 and that of the solvent were changed to 10 pts. wt. of commercially-available resin 3 pellets, and 90 pts. wt. of decahydronaphthalene, respectively.

Example Solution 12

A thermal imprinting resin solution was prepared through the same scheme except that the blend amount of the pellets of commercially-available resin 4 of the example solution 8 and that of the solvent were changed to 11 pts. wt. of commercially-available resin 4 pellets, and 89 pts. wt. of decahydronaphthalene, respectively.

Evaluation for Particle on Etching Mask

The thermal imprinting resin solutions which were the example solutions 1 to 12 were each applied on a 4-inch silicon wafer (substrate main body) using a spin coater (SC-300 made by E.H.C corporation), the solvent was eliminated through a drying process by heating to be discussed later, and an etching mask was produced (examples 1 to 12). The spin coating condition was 400 rpm×5 sec+4000 rpm×20 sec for the solutions 1 to 8 for the example, 400 rpm×5 sec+2000 rpm×20 sec for the solutions 9, 11, and 12 for the example, and 400 rpm×5 sec+2300 rpm×20 sec for the solution 10 for the example. Moreover, using the example solution 3, an etching mask was produced on a glass substrate through a solution casting technique (example 13).

The drying process by heating was carried out as follow.

Drying process by heating: Under a nitrogen airstream, an etching-mask-coated wafer (a base material with an etching mask) was subjected to pre-drying for 10 minutes at 100° C., was subjected to pressure reduction at a room temperature in a vacuum heating/drying machine to equal to or less than 1 torr, was subjected to temperature rising to 200° C., and then maintained under reduced pressure for 20 minutes. With the interior of the drying machine being maintained at equal to or less than 1 torr, the wafer was caused to stand to cool to a room temperature, was subjected to pressure release with nitrogen, and the wafer was taken out.

Regarding measurement for the film thickness of an etching mask, the thickness was measured using an automatic ellipsometer (MARY-102FM) made by Five Lab Co., Ltd. The surface of a resin after an etching mask was formed was measured using a microscope (VH-X450) made by Keyence Corporation, and when no particle-like material was observed, it is indicated in table 1 by a double circular mark, and when any particle-like material was hardly observed, it is indicated in the table by a circular mark.

TABLE 1

| Etching mask | Resin solution for thermal imprinting | Film thickness (nm) | Evaluation for particle on mask |
| --- | --- | --- | --- |
| Example 1 | Example solution 1 | 100 | ◎ |
| Example 2 | Example solution 2 | 100 | ◎ |
| Example 3 | Example solution 3 | 115 | ○ |
| Example 4 | Example solution 4 | 115 | ○ |
| Example 5 | Example solution 5 | 115 | ○ |
| Example 6 | Example solution 6 | 86 | ○ |
| Example 7 | Example solution 7 | 76 | ○ |
| Example 8 | Example solution 8 | 127 | ○ |
| Example 9 | Example solution 9 | 1043 | ◎ |
| Example 10 | Example solution 10 | 1002 | ○ |
| Example 11 | Example solution 11 | 1042 | ○ |
| Example 12 | Example solution 12 | 1036 | ○ |
| Example 13 | Example solution 3 | 4000 | ○ |

Thermal Imprinting Evaluation for Etching Mask

Thermal imprinting evaluation was carried out using etching masks of examples 1 to 13. An imprinting device (VX-2000N-US) made by SCIVAX corporation was used for thermal imprinting evaluation, and each mask was fixed on a substrate heated to the glass transition temperature Tg −20°

C. of a corresponding resin. Thermal imprinting was performed using a mold (a hole pattern with depth 140 nm/diameter 100 to 250 nm or honey-comb pattern with depth 370 nm/wall width 250 nm/one side 2 mm) heated to the molding setting temperature Tg+30° C., and when the pattern of the mold was transferred notably precisely, it is indicated in table 2 by a double circular mark, and when the pattern was transferred precisely, it is indicated in the table by a circular mark. Note that the remaining volatile constituents were analyzed and quantified through gas chromatography by dissolving the mask with toluene again.

TABLE 2

| Etching mask | Film thickness (nm) | Remaining volatile constituent (ppm) | Thermal imprinting evaluation |
|---|---|---|---|
| Example 1 | 100 | <10 | ⊚ |
| Example 2 | 100 | <10 | ⊚ |
| Example 3 | 115 | <10 | ○ |
| Example 4 | 115 | <10 | ○ |
| Example 5 | 115 | <10 | ○ |
| Example 6 | 86 | <10 | ○ |
| Example 7 | 76 | <10 | ○ |
| Example 8 | 127 | <10 | ○ |
| Example 9 | 1043 | <10 | ⊚ |
| Example 10 | 1002 | <10 | ○ |
| Example 11 | 1042 | <10 | ○ |
| Example 12 | 1036 | <10 | ○ |
| Example 13 | 4000 | 1545 | ○ |

Note that "<10" in the table means less than 10 ppm.

It is also confirmed that formation of a pattern deeper relative to an actual film thickness is possible as a resin depressed by the mold goes inwardly of the pattern at the time of imprinting even if a mold having a pattern deeper relative to a film thickness is used.

Etching Evaluation 1 for Etching Mask

Films formed of the resin 1, the resin 2, the resin 3, and the resin 4, respectively, and each having a thickness of 1 μm was prepared, and the etching rate (nm/min) of each resin was evaluated. An etching device used was EXAM made by SINKO SEIKI Co, Ltd., and a gas and power for etching were as follows.

Only $O_2$: 180 W $CHF_3$ and tiny amount of $O_2$: 350 W $CHF_3$ and tiny amount of $SF_6$: 300 W Only $SF_6$: 100 W Moreover, an etching rate relative to each kind of gas for each resin, a selectivity (Si/resin) relative to Si, and a selectivity (Mo/resin) relative to Mo were evaluated. Results are shown in table 3, table 4, table 5, and table 6.

TABLE 3

| | Etching rate (nm/min) | | | | |
|---|---|---|---|---|---|
| Etching gas | Resin 1 | Resin 2 | Resin 3 | Resin 4 | Si |
| $O_2$ | 372.0 | 351.7 | 392.5 | 354.6 | — |
| $CHF_3 + O_2$ | 34.5 | 36.3 | 40.1 | 34.3 | 22.8 |
| $CHF_3 + SF_6$ | 40.1 | 52.1 | 45.3 | 32.4 | 73.8 |

TABLE 4

| | Selectivity (Si/resin) | | | |
|---|---|---|---|---|
| Etching gas | Resin 1 | Resin 2 | Resin 3 | Resin 4 |
| $CHF_3 + O_2$ | 0.66 | 0.63 | 0.57 | 0.66 |
| $CHF_3 + SF_6$ | 1.84 | 1.41 | 1.63 | 2.28 |

TABLE 5

| | Etching rate (nm) | | | | |
|---|---|---|---|---|---|
| Etching gas | Resin 1 | Resin 2 | Resin 3 | Resin 4 | Mo |
| $SF_6$ | 43 | — | — | — | 101 |

TABLE 6

| | Selectivity (Mo/resin) | | | |
|---|---|---|---|---|
| Etching gas | Resin 1 | Resin 2 | Resin 3 | Resin 4 |
| $SF_6$ | 2.35 | — | — | — |

As a result, it becomes clear that an extremely large etching rate relative to an $O_2$ gas is acquired, and it is proper for ashing. Moreover, it becomes clear that a sufficient selectivity relative to an Si substrate or an Mo substrate is acquired, and it can used as an etching mask.

Etching Evaluation 2 for Etching Mask

An etching mask formed of the resin 2 and having a thickness of 1 μm was formed on a substrate (base material main body) of 4-inch Si, and a line-and-space like pattern having a depth of 5 μm, a width of 5 μm, and a pitch of 10 μm was formed thereon by thermal imprinting, and was subjected to etching, thereby evaluating a pattern formed on each substrate.

An etching mask formed of the resin 1 and having a thickness of 1 μm was formed on a substrate (base material main body) of 4-inch $SiO_2$, and a line-and-space like pattern having a depth of 5 μm, a width of 5 μm, and a pitch of 10 μm was formed thereon by thermal imprinting, and was subjected to etching, thereby evaluating a pattern formed on each substrate.

Thermal imprinting was carried out as follow. First, a substrate with an etching mask and a mold were heated to 160° C., depressed against each other at a depressing speed of 10 μm/sec until load became 2000 N, and held for 2 min at this pressure. Thereafter, the substrate and the mold were cooled to a temperature of 120° C., and demolding was performed at a demolding speed of 10 μm/sec. Thermal imprinting was carried out using an imprint device (X-200) made by SCIVAX Corporation.

Moreover, etching was carried out using EXAM made by SINKO SEIKI Co., Ltd., under following conditions.

Si substrate: etched for 8 minutes using $CHF_3$ and tiny amount of $O_2$ at 350 W $SiO_2$ substrate: etched for 8 minutes using $CHF_3$ and tiny amount of $SF_6$, at 300 W, and subjected to ashing for 30 seconds using $O_2$ at 180 W FIGS. 1 to 4 are photos showing a pattern observed through an SEM before etching and after etching.

Figure 2:
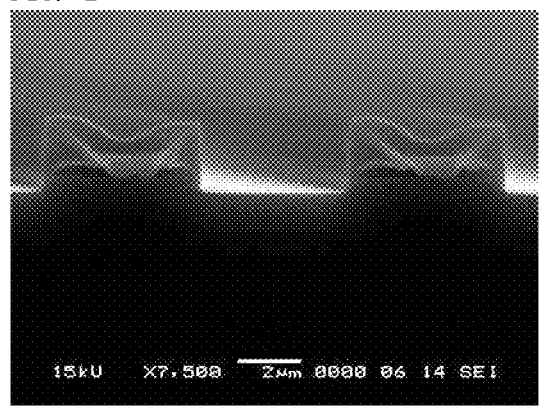
FIG. 2 is an SEM image showing a cross-sectional surface of the Si substrate and that of the etching mask after etching.

As is clear from FIGS. 1 and 2, a pattern was formed on an Si substrate.

Figure 3:
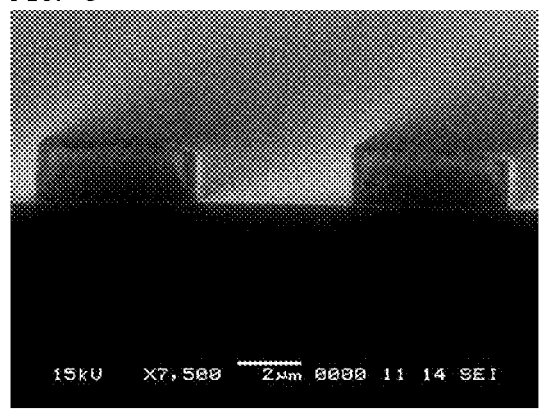
FIG. 3 is an SEM image showing a cross-sectional surface of an Si substrate and that of an etching mask prior to etching.
Figure 4:
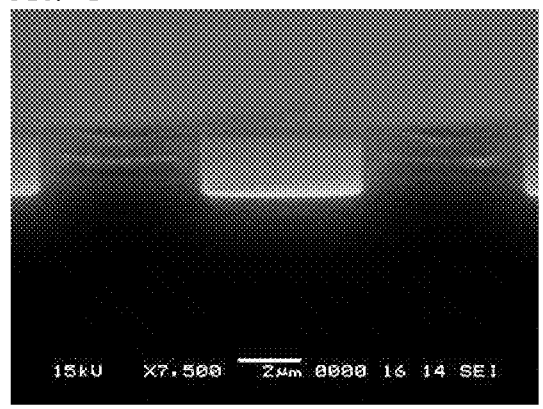
FIG. 4 is an SEM image showing a cross-sectional surface of the Si substrate and that of the etching mask after etching.

As is clear from FIGS. 3 and 4, a sufficient pattern was formed on an SiO$_2$ substrate.

As explained above, according to the present invention, there is provided an etching mask which has a superior thermal imprinting characteristic and also a good anti-etching characteristic in an etching process for Si, SiO$_2$ which is an oxidation product thereof, and Mo which is a metal.

It is to be understood that additional embodiments of the present invention described herein may be contemplated by one of ordinary skill in the art and that the scope of the present invention is not limited to the embodiments disclosed. While specific embodiments of the present invention have been illustrated and described, numerous modifications come to mind without significantly departing from the spirit of the invention, and the scope of protection is only limited by the scope of the accompanying claims.

The invention claimed is:

1. An etching mask comprising: a thermoplastic resin capable of etching a base material including a silicon with an etching gas including CHF$_3$ and/or SF$_6$ and the thermoplastic resin containing at least one kind of skeleton expressed by a chemical formula (1) or a chemical formula (2) in a main chain:

[Chemical Formula 1]

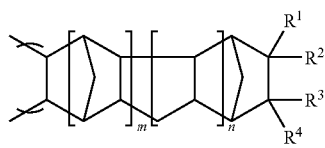

(1)

[Chemical Formula 2]

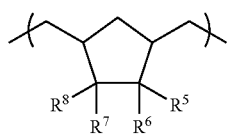

(2)

wherein R$^1$ and R$^2$ in the chemical formula (1) are a hydrocarbon group having a carbon number of 1 to 15; and, wherein R$^3$ and R$^4$ in the chemical formula (1) are hydrogen atoms; and, wherein R$^5$, R$^6$, R$^7$, R$^8$ in the chemical formula(2) are different or the same as one another, each of which is selected from the group consisting of: a hydrogen atom; a deuterium atom; a hydrocarbon group having a carbon number of 1 to 15; a halogen atom; a substituent group containing a hetero atom of oxygen or sulfur; and a ring structure formed with one another; and, wherein m and n are integers equal to or greater than 0, and the etching mask has a film thickness of 10 nm to 40 μm.

2. The etching mask according to claim 1, wherein the thermoplastic resin is a copolymer of a cyclic olefin expressed by a chemical formula (3) and an α-olefin, or a polymer produced by hydrogenation after ring-opening polymerization of the cyclic olefin:

[Chemical Formula 3]

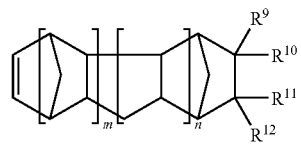

(3)

wherein R$^9$ and R$^{10}$ in the chemical formula (3) are a hydrocarbon group having a carbon number of 1 to 15; and, wherein R$^{11}$ and R$^{12}$ in the chemical formula (3) are hydrogen atoms; and, wherein m and n are integers equal to or greater than 0.

3. The etching mask according to claim 1, formed from an imprinting resin solution which contains the thermoplastic resin containing at least one kind of skeleton expressed by the chemical formula (1) or the chemical formula (2), and at least one kind of solvent that dissolves the resin, and which has a containing amount of foreign materials less than 3000 particles/cm$^3$, each foreign material having a grain diameter of equal to or greater than 0.2 μm.

4. The etching mask according to claim 1, having a remaining volatile constituent equal to or less than 0.25%.

5. The etching mask according to claim 1, with a predetermined pattern.

6. The etching mask according to claim 5, wherein the pattern is formed through a thermal imprinting process.

7. A base material with an etching mask, comprising a base material main body and an etching mask formed on the base material main body according to claim 1.

8. The etching-mask-formed base material according to claim 7, wherein the base material main body is any one of followings: Si; SiO$_2$; and Mo.

9. A microfabricated product comprising a base material, and the etching mask according to claim 1 formed on a base material main body, the etching-mask-formed base material having a predetermined pattern formed through a thermal imprinting process, wherein another predetermined pattern is formed on the base material main body by performing etching on the etching-mask-formed base material.

10. A method of producing a microfabricated product, comprising:
    forming the etching mask according to claim 1 on a base material main body;
    forming a predetermined pattern in the etching mask through a thermal imprinting process; and
    performing etching on the base material with the etching mask with the pattern, thereby forming another predetermined pattern on the base material main body.

11. The etching mask according to claim 1, wherein R$^1$ and R$^5$ are methyl groups, and R$^2$ and R$^6$ are phenyl group.

12. The etching mask according to claim 1, wherein the thermoplastic resin contains a copolymer of ethylene and 5-methyl-5-phenylnorbornene.

13. The base material with the etching mask according to claim 7, wherein the thermoplastic resin of the etching mask contains a copolymer of ethylene and 5-methyl-5-phenylnorbornene.

14. The etching-mask-formed base material according to claim 8, wherein the thermoplastic resin of the etching mask contains a copolymer of ethylene and 5-methyl-5-phenylnorbornene.

15. The microfabricated product according to claim 9, wherein the thermoplastic resin of the etching mask contains a copolymer of ethylene and 5-methyl-5-phenylnorbornene.

16. The method of producing a microfabricated product according to claim 10, wherein the thermoplastic resin of the etching mask contains a copolymer of ethylene and 5-methyl-5-phenylnorbornene.

17. The etching mask according to claim 1 wherein a selectivity of the etching mask relative to Si is 1.84 or greater.

18. An etching mask comprising:

a thermoplastic resin containing at least one kind of skeleton expressed by a chemical formula (1) or a chemical formula (2) in a main chain:

[Chemical Formula 1]

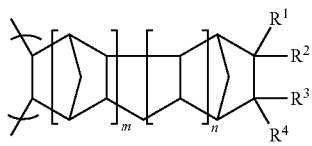
(1)

[Chemical Formula 2]

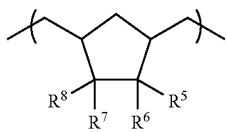
(2)

wherein $R^1$ and $R^2$ in the chemical formula (1) are a hydrocarbon group having a carbon number of 1 to 15; and, wherein $R^3$ and $R^4$ in the chemical formula (1) are hydrogen atoms; and, wherein $R^5$, $R^6$, $R^7$, $R^8$ in the chemical formula (2) are different or the same as one another, each of which is selected from the group consisting of: a hydrogen atom; a deuterium atom; a hydrocarbon group having a carbon number of 1 to 15; a halogen atom; a substituent group containing a hetero atom of oxygen or sulfur; and a ring structure formed with one another;

wherein m and n are integers equal to or greater than 0;

wherein the etching mask has a film thickness of 10 nm to 40 μm; and, wherein a selectivity of the etching mask relative to Si is 1.84 or greater.

* * * * *